(12) United States Patent
Huang et al.

(10) Patent No.: US 11,107,879 B2
(45) Date of Patent: Aug. 31, 2021

(54) CAPACITOR STRUCTURE AND FABRICATION METHOD THEREOF

(71) Applicants: UNITED MICROELECTRONICS CORP., Hsin-Chu (TW); Fujian Jinhua Integrated Circuit Co., Ltd., Quanzhou (CN)

(72) Inventors: Kai-Lou Huang, New Taipei (TW); Fu-Che Lee, Taichung (TW); Feng-Yi Chang, Tainan (TW); Chieh-Te Chen, Kaohsiung (TW); Meng-Chia Tsai, Kaohsiung (TW)

(73) Assignees: UNITED MICROELECTRONICS CORP., Hsin-Chu (TW); Fujian Jinhua Integrated Circuit Co., Ltd., Quanzhou (CN)

( * ) Notice: Subject to any disclaimer, the term of this patent is extended or adjusted under 35 U.S.C. 154(b) by 0 days.

(21) Appl. No.: 16/154,680

(22) Filed: Oct. 8, 2018

(65) Prior Publication Data

US 2020/0083317 A1    Mar. 12, 2020

(30) Foreign Application Priority Data

Sep. 7, 2018    (CN) .......................... 201811041793.6

(51) Int. Cl.
*H01L 27/108* (2006.01)
*H01L 49/02* (2006.01)
*H01L 23/532* (2006.01)

(52) U.S. Cl.
CPC ........ *H01L 28/60* (2013.01); *H01L 23/53295* (2013.01); *H01L 27/10852* (2013.01)

(58) Field of Classification Search
CPC ................................................. H01L 27/10852
USPC .......................................................... 438/125
See application file for complete search history.

(56) References Cited

U.S. PATENT DOCUMENTS

| 6,383,863 | B1 * | 5/2002 | Chiang | ............ H01L 21/76889 |
|           |      |        |        | 257/E21.013 |
| 8,969,167 | B2 | 3/2015 | Yoon | |
| 9,159,729 | B2 | 10/2015 | Kim | |
| 9,240,441 | B2 | 1/2016 | Yoon | |
| 2006/0086952 | A1 | 4/2006 | Kim | |
| 2010/0193853 | A1 | 8/2010 | Busch | |
| 2012/0235279 | A1 * | 9/2012 | Seo | .......................... H01L 28/60 |
|              |      |        |     | 257/532 |
| 2015/0325636 | A1 | 11/2015 | Otsuka | |
| 2019/0006366 | A1 * | 1/2019 | Leobandung | ..... H01L 27/10844 |

* cited by examiner

*Primary Examiner* — Hsin Yi Hsieh
(74) *Attorney, Agent, or Firm* — Winston Hsu

(57) ABSTRACT

A capacitor structure includes a substrate having thereon a storage node contact, a cylinder-shaped bottom electrode disposed on the storage node contact, a supporting structure horizontally supporting a sidewall of the cylinder-shaped bottom electrode, a capacitor dielectric layer conformally covering the cylinder-shaped bottom electrode and the supporting structure, and a top electrode covering the capacitor dielectric layer. The supporting structure has a top surface that is higher than that of the cylinder-shaped bottom electrode. The top surface of the supporting structure has a V-shaped sectional profile.

18 Claims, 6 Drawing Sheets

CAPACITOR STRUCTURE AND FABRICATION METHOD THEREOF

BACKGROUND OF THE INVENTION

1. Field of the Invention

The present invention relates to the field of semiconductor technology, and more particularly to an improved semiconductor capacitor structure and a method of fabricating the same.

2. Description of the Prior Art

With the advancement of semiconductor process technology, the size of semiconductor devices is getting smaller and smaller, and semiconductor processes are encountering more and more challenges. For example, a capacitor structure of a dynamic random access memory (DRAM) typically has an elongated (or high aspect ratio) cylindrical bottom electrode for maintaining a certain capacitance value. To avoid collapse of the cylindrical bottom electrode, a supporting structure is usually formed.

However, according to the prior art processes for forming the supporting structure, the top surface of the upper support layer would have a pointed shape, resulting in an increased risk of corona discharge. In addition, a gap would be easily formed between the bottom electrode and the capacitor dielectric layer, which easily causes the capacitor dielectric layer to peel off or fall off.

Therefore, there is still a need in the art for an improved semiconductor capacitor structure and method of fabricating the same to address the deficiencies and shortcomings of the prior art described above.

SUMMARY OF THE INVENTION

The present invention provides an improved semiconductor capacitor structure and method of fabricating the same to avoid the top surface of the upper support layer from exhibiting a pointed shape, thereby reducing the risk of corona discharge.

According to one embodiment of the invention, a capacitor structure includes a substrate having thereon a storage node contact, a cylinder-shaped bottom electrode disposed on the storage node contact, a supporting structure horizontally supporting a sidewall of the cylinder-shaped bottom electrode, a capacitor dielectric layer conformally covering the cylinder-shaped bottom electrode and the supporting structure, and a top electrode covering the capacitor dielectric layer.

According to one embodiment of the invention, a method for forming a capacitor structure is disclosed. A substrate having thereon a storage node contact is provided. A cylinder-shaped bottom electrode is formed on the storage node contact. A supporting structure that horizontally supports a sidewall of the cylinder-shaped bottom electrode is formed. The supporting structure has a top surface that is higher than a top surface of the cylinder-shaped bottom electrode. The top surface of the supporting structure has a V-shaped indentation. A capacitor dielectric layer is formed over the cylinder-shaped bottom electrode and the supporting structure. A top electrode is formed over the capacitor dielectric layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
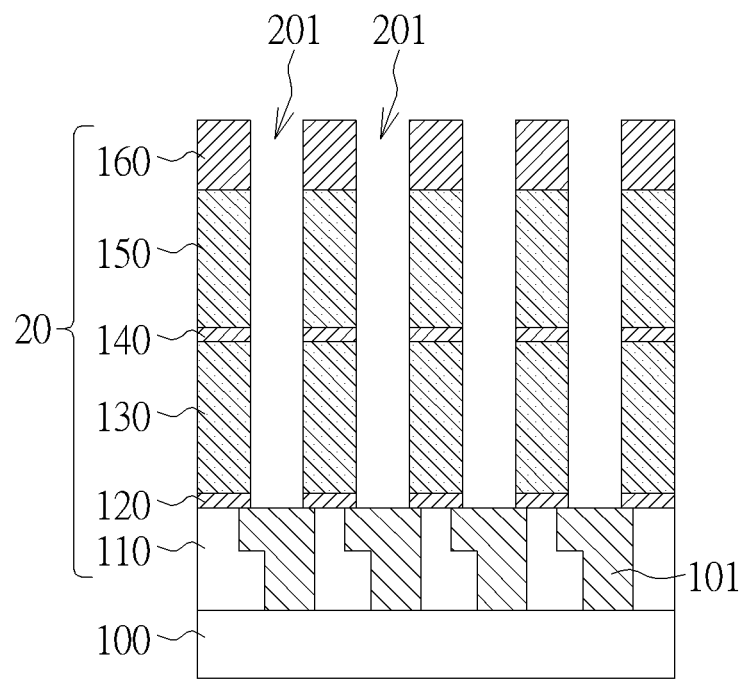
FIG. 1 to FIG. 9 are schematic cross-sectional views showing a method of fabricating a semiconductor capacitor structure according to an embodiment of the invention.

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

The following detailed description is, therefore, not to be taken in a limiting sense, and the scope of the present invention is defined only by the appended claims, along with the full scope of equivalents to which such claims are entitled. One or more implementations of the present invention will now be described with reference to the attached drawings, wherein like reference numerals are used to refer to like elements throughout, and wherein the illustrated structures are not necessarily drawn to scale.

Please refer to FIG. 1 to FIG. 9, which are schematic cross-sectional views showing a method of fabricating a semiconductor capacitor structure according to an embodiment of the invention. As shown in FIG. 1, a substrate 100, such as a silicon substrate, is provided. According to an embodiment of the present invention, a dielectric layer or a semiconductor structure may be formed on the silicon substrate, but is not limited thereto. According to an embodiment of the invention, at least one storage node contact 101 is provided on the substrate 100. For example, the storage node contact 101 may be made of a conductive material such as tungsten or titanium nitride.

According to an embodiment of the invention, a stacked dielectric layer 20 is disposed on the substrate 100, including but not limited to, an interlayer dielectric layer 110, an etch stop layer 120, a lower template layer 130, a lower support layer 140, and an upper template layer 150 and an upper support layer 160.

According to an embodiment of the invention, the lower support layer 140 and the upper support layer 160 may comprise tantalum nitride (SiN) or silicon carbon nitride (SiCN). The interlayer dielectric layer 110 may include a silicon oxide layer, but is not limited thereto. The lower template layer 130 and the upper template layer 150 may include a silicon oxide layer, but are not limited thereto. According to an embodiment of the invention, the lower template layer 130 and the upper template layer 150 are selectively removed in a subsequent step, leaving the lower support layer 140 and the upper support layer 160 such that the lower support layer 140 and the upper support layer 160 horizontally support sidewall of a cylinder-shaped bottom electrode.

According to an embodiment of the invention, the storage node contact 101 may be formed in the interlayer dielectric layer 110. According to an embodiment of the invention, at least one storage node opening 201 is formed in the stacked dielectric layer 20 to partially expose an upper surface of the storage node contact 101.

Figure 2:
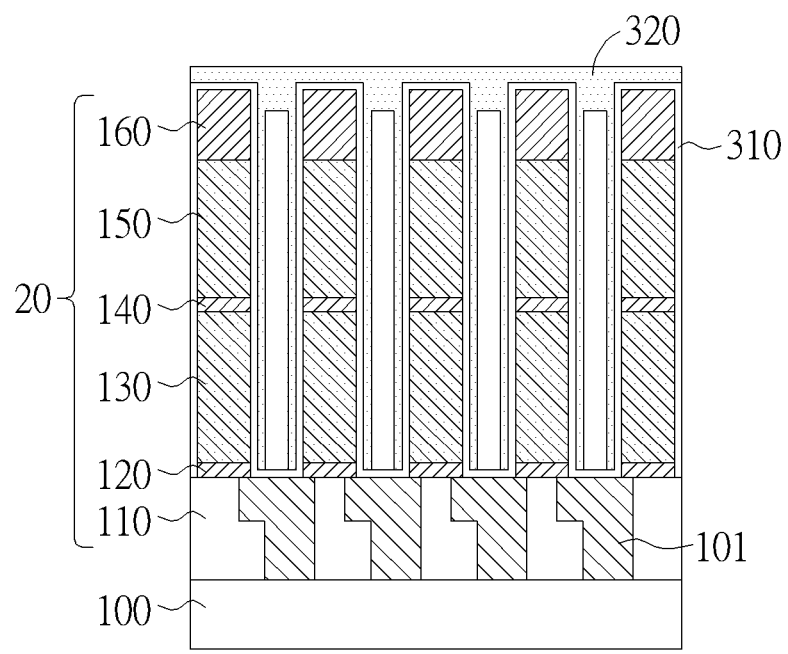

As shown in FIG. 2, a chemical vapor deposition (CVD) process or an atomic layer deposition (ALD) process is then performed to form a conformal bottom electrode layer 310, for example, a titanium nitride layer, on the substrate 100. The bottom electrode layer 310 conformally covers the inner wall and the bottom of the storage node opening 201 and is in direct contact with the storage node contact 101. Then, another CVD process or ALD process is performed to deposit a silicon oxide layer 320 on the bottom electrode layer 310. According to an embodiment of the invention, the silicon oxide layer 320 does not fill up the storage node opening 201 and may form an air gap in the storage node opening 201.

Figure 3:
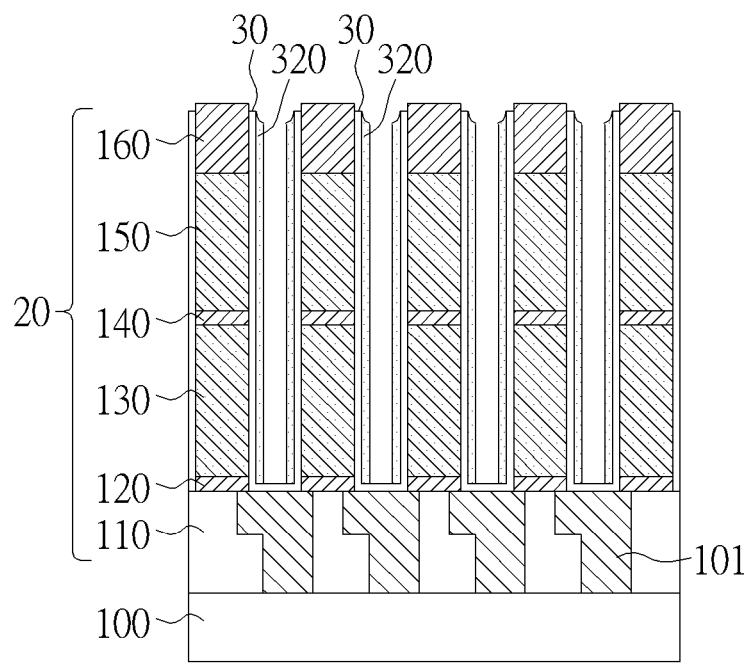

As shown in FIG. 3, an etch back process is performed to etch away portions of the silicon oxide layer 320 and the bottom electrode layer 310 to expose a portion of the upper support layer 160. According to an embodiment of the invention, the etch back process may be a plasma dry etch process, but is not limited thereto. At this point, a cylinder-shaped bottom electrode 30 is formed on each of the storage node contacts 101. The cylinder-shaped bottom electrode 30 comprises titanium nitride (TiN).

Figure 4:
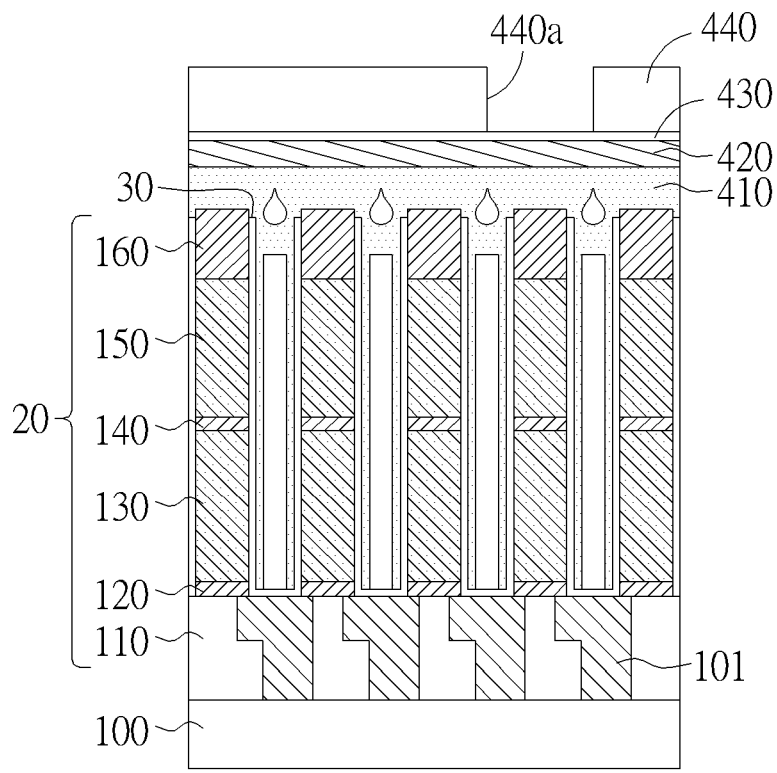

As shown in FIG. 4, a pattern transfer stack structure is then formed on the substrate 100, including, but not limited to, a silicon oxide layer 410, a hard mask layer 420, and a bottom anti-reflective layer 430. Then, a photoresist pattern 440 is formed on the bottom anti-reflective layer 430, and an opening 440a is formed in the photoresist pattern 440 by a process such as exposure and development. According to an embodiment of the invention, this opening 440a defines the extent of the upper support layer 160 that will be subsequently removed.

Figure 5:
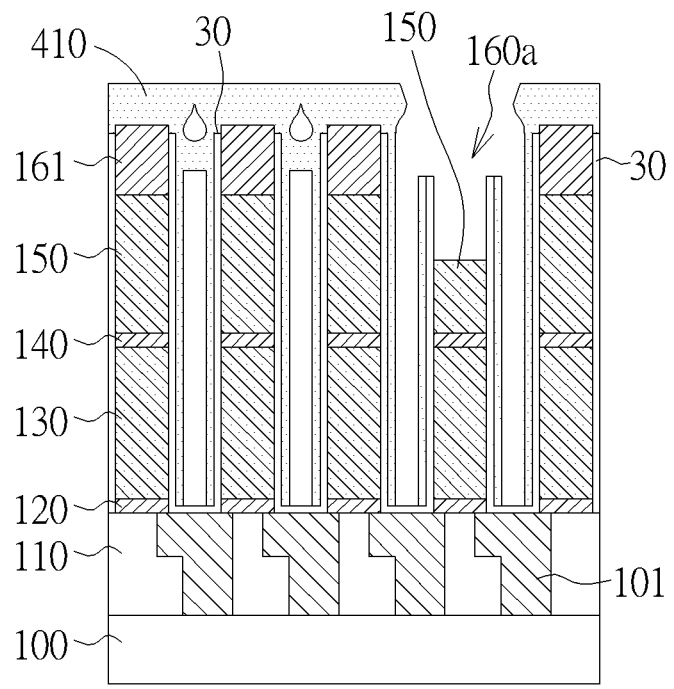

As shown in FIG. 5, an anisotropic dry etching process is then performed. The pattern transfer stack structure is etched through the opening 440a of the photoresist pattern 440, and the portion of the upper support layer 160 is then etched away, thus the upper template layer 150 is partially revealed and an opening 160a is defined. The remaining upper support layer 160 constitutes a supporting structure 161.

According to an embodiment of the invention, the supporting structure 161 has an upper surface that is higher than the upper surface of the cylinder-shaped bottom electrode 30. According to an embodiment of the invention, the supporting structure 161 horizontally supports the sidewall of the cylinder-shaped bottom electrode 30. According to an embodiment of the invention, the supporting structure 161 is in direct contact with the sidewall of the cylinder-shaped bottom electrode 30. The supporting structure 161 comprises silicon nitride (SiN) or silicon carbon nitride (SiCN).

Figure 6:
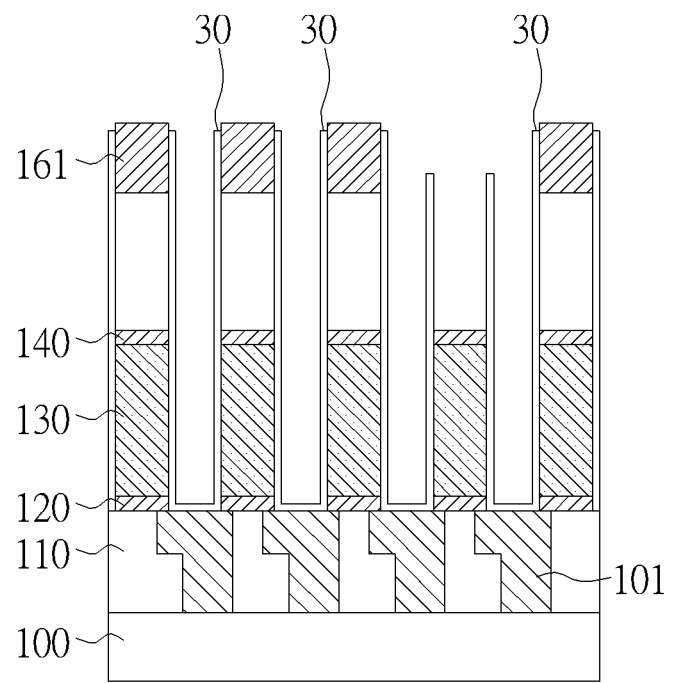

Subsequently, as shown in FIG. 6, the remaining silicon oxide layer 410, the upper template layer 150, and the silicon oxide layer 320 are completely removed by an etching process, for example, a wet etching process, to expose the lower support layer 140.

Figure 7:
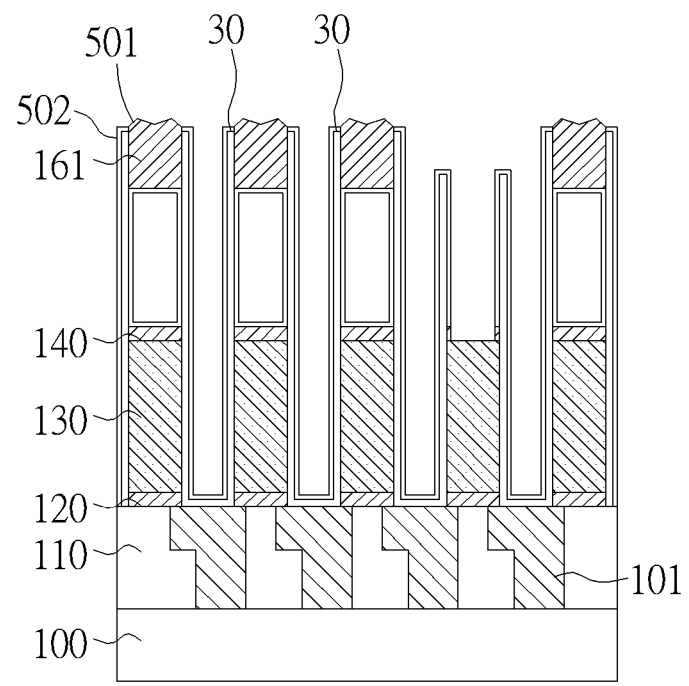

As shown in FIG. 7, an oxygen ($O_2$) treatment and a chlorine gas ($Cl_2$) etch process are then performed, and a portion of the lower support layer 140 is etched away through the opening 160a formed in the upper support layer 160 to expose a portion of the lower template layer 130.

Figure 10:
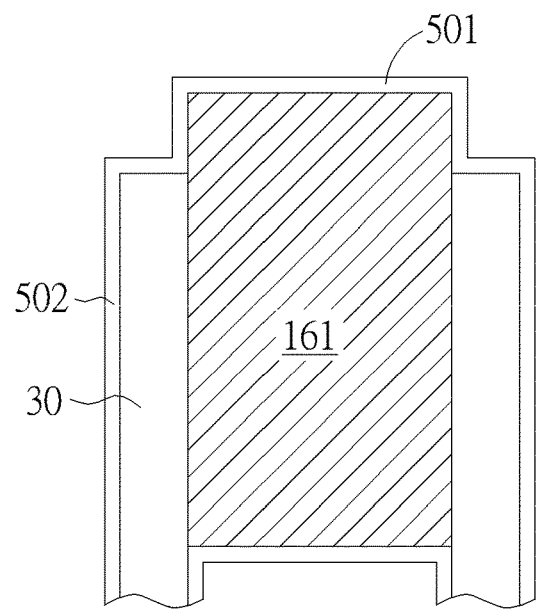
FIG. 10 to FIG. 12 show the cross-sectional profiles of the top portion of the supporting structure and the portion of the cylinder-shaped bottom electrode surrounding the top portion of the supporting structure during the oxygen treatment and chlorine etch process.
Figure 11:
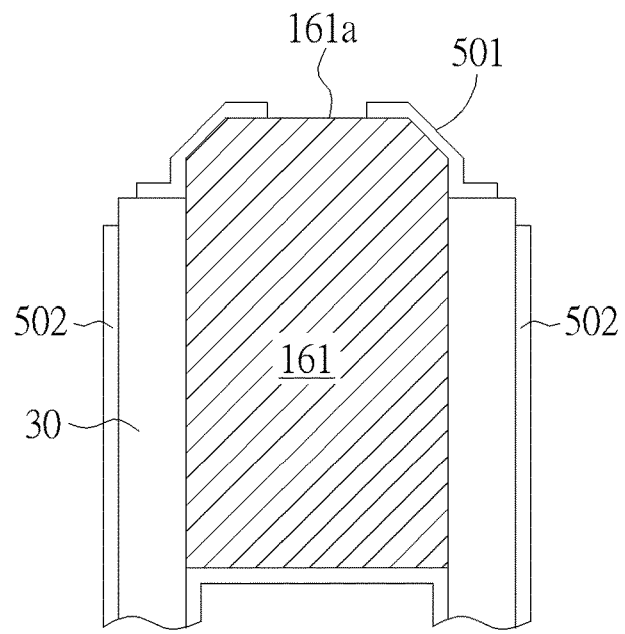
Figure 12:
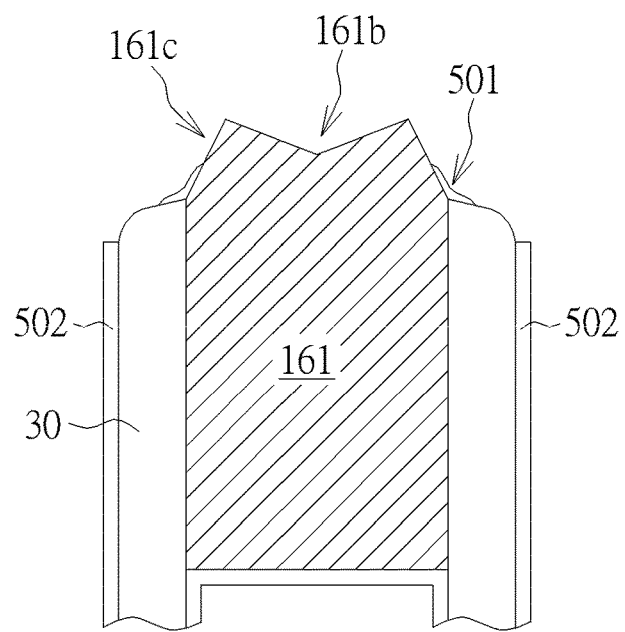

Referring briefly to FIG. 10 to FIG. 12, the cross-sectional profiles of the top portion of the supporting structure 161 and the portion of the cylinder-shaped bottom electrode 30 surrounding the top portion of the supporting structure 161 during the oxygen treatment and chlorine etch process are described.

As shown in FIG. 10, the supporting structure 161 originally has a flat upper surface 161a higher than the upper surface of the cylinder-shaped bottom electrode 30 therearound. First, an oxygen treatment is performed to form a first protective layer 501, for example, silicon oxynitride (SiON) or silicon oxycarbonnitride (SiOCN), on the supporting structure 161, and a second protection layer 502, for example, titanium dioxide ($TiO_2$) on the surface of the cylinder-shaped bottom electrode 30.

Then, as shown in FIG. 11 and FIG. 12, the etching of the supporting structure 161 and the lower support layer 140 (FIG. 7) continues by using chlorine plasma in a biased etching environment (the bombardment is the main etching mechanism) so as to remove a portion of the lower support layer 140, such that the originally flat upper surface 161a of the supporting structure 161 is bombarded into a concave upper surface 161b having a V-shaped cross-sectional profile and an oblique sidewall 161c. The oblique sidewall 161c extends downwardly to the top surface of the cylinder-shaped bottom electrode 30.

As can be seen from FIG. 12, the supporting structure 161 is in intimate contact with the surrounding cylinder-shaped bottom electrode 30, and no gap is formed between the supporting structure 161 and the cylinder-shaped bottom electrode 30, so that peel off or fall off problem of the capacitor dielectric layer can be avoided.

As shown in FIG. 12, a portion of the first protective layer 501 may remain on the oblique sidewall 161c of the supporting structure 161, and a portion of the second protective layer 502 may remain on the surface of the cylinder-shaped bottom electrode 30. However, in other embodiments, the residual first protective layer 501 and the second protective layer 502 may be completely removed.

Figure 8:
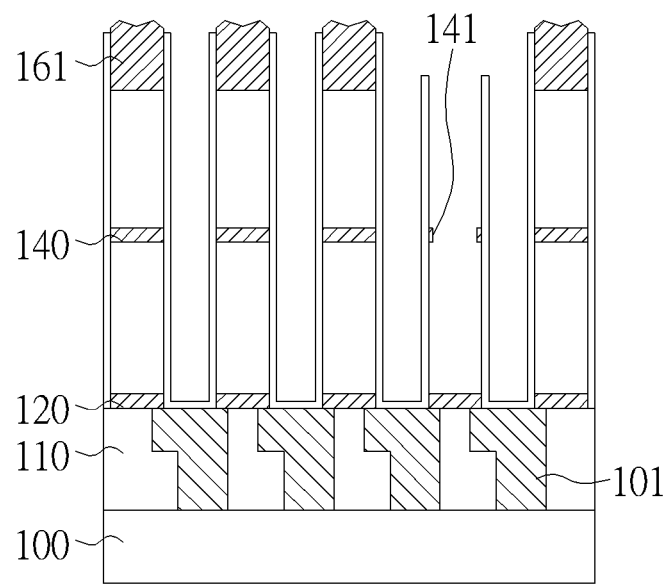

As shown in FIG. 8, the lower template layer 130 is then completely removed using an etching process, such as a wet etching process, to expose the lower sidewalls of the cylinder-shaped bottom electrode 30. As can be seen from FIG. 8, in the foregoing step of etching the lower support layer 140, since the lateral etching is not obvious, a waistband-like protrusion 141 may be left on the sidewall of the cylinder-shaped bottom electrode 30, which is another structural feature.

Figure 9:
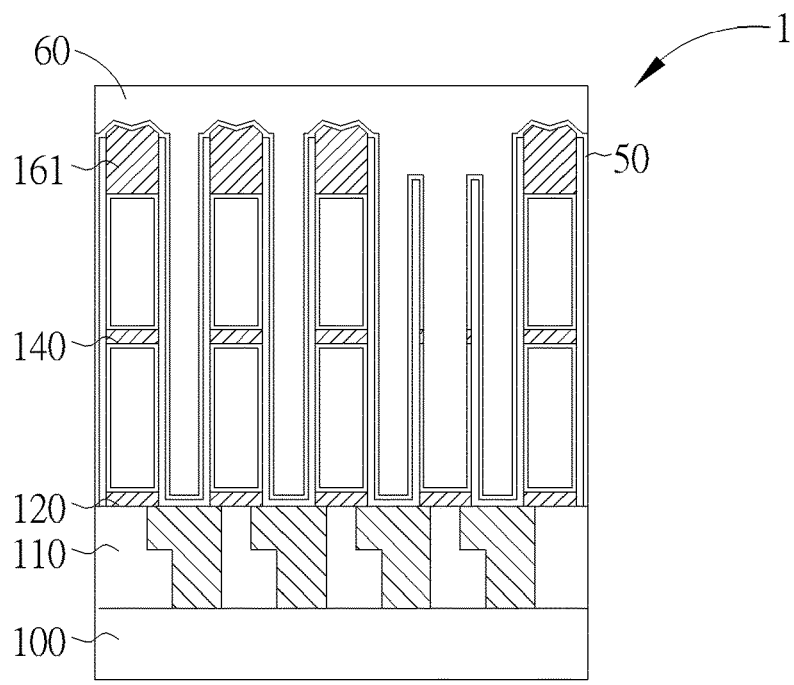

As shown in FIG. 9, a capacitor dielectric layer 50 is then deposited on the substrate 100 to cover the cylinder-shaped bottom electrode 30 and the supporting structure 161. According to an embodiment of the invention, the capacitor dielectric layer 50 also covers the surface of the remaining lower support layer 140 (including the protrusion 141). The capacitor dielectric layer 50 may comprise any suitable high-k dielectric layer. Finally, an top electrode 60, for example, metal such as titanium nitride (TiN) or the like, is formed on the capacitor dielectric layer 50 to complete the fabrication of the capacitor structure 1 of the present invention.

Structurally, as can be seen from FIG. 9 and FIG. 12, the capacitor structure 1 of the present invention comprises a substrate 100 having a storage node contact 101, a cylinder-shaped bottom electrode 30 disposed on the storage node contact 101, a supporting structure 161 horizontally supporting a sidewall of the cylinder-shaped bottom electrode 30, a capacitor dielectric layer 50 conformally covering of the cylinder-shaped bottom electrode 30 and the supporting structure 161, and a top electrode 60 overlying the capacitor dielectric layer 50. The supporting structure 161 has a top surface 161b and an oblique sidewall 161c higher than the top surface of the cylinder-shaped bottom electrode 30. The top surface 161b of the supporting structure has a V-shaped sectional profile.

Another advantage of the present invention is that since the second protective layer 502 protects the top profile of the cylinder-shaped bottom electrode 30, the height of the cylinder-shaped bottom electrode 30 can be maintained, and thus the capacitance value of the capacitor structure 1 of the present invention can be further improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A capacitor structure, comprising:
   a substrate having thereon a storage node contact;
   a cylinder-shaped bottom electrode disposed on the storage node contact;
   a supporting structure horizontally supporting a sidewall of the cylinder-shaped bottom electrode, wherein the supporting structure has a top surface that is higher than an uppermost point of the cylinder-shaped bottom electrode, and wherein the top surface of the supporting structure has a V-shaped sectional profile;
   a capacitor dielectric layer conformally covering the cylinder-shaped bottom electrode and the supporting structure; and
   a top electrode covering the capacitor dielectric layer.

2. The capacitor structure according to claim 1, wherein the supporting structure is in direct contact with the sidewall of the cylinder-shaped bottom electrode.

3. The capacitor structure according to claim 1, wherein the supporting structure comprises an oblique sidewall extending downwardly to a top surface of the cylinder-shaped bottom electrode.

4. The capacitor structure according to claim 3, wherein the supporting structure comprises SiN or SiCN.

5. The capacitor structure according to claim 4, wherein the cylinder-shaped bottom electrode comprises TiN.

6. The capacitor structure according to claim 5 further comprising:
   a first protective layer on the oblique sidewall of the supporting structure; and
   a second protective layer on the cylinder-shaped bottom electrode.

7. The capacitor structure according to claim 6, wherein the first protective layer comprises SiON or SiOCN.

8. The capacitor structure according to claim 6, wherein the second protective layer comprises $TiO_2$.

9. A method for forming a capacitor structure, comprising:
   providing a substrate having thereon a storage node contact;
   forming a cylinder-shaped bottom electrode on the storage node contact;
   forming a supporting structure horizontally supporting a sidewall of the cylinder-shaped bottom electrode;
   forming a capacitor dielectric layer over the cylinder-shaped bottom electrode and the supporting structure, wherein the supporting structure has a top surface that is higher than an uppermost point of the cylinder-shaped bottom electrode, and wherein the top surface of the supporting structure has a V-shaped indentation; and
   forming a top electrode over the capacitor dielectric layer.

10. The method according to claim 9, wherein the supporting structure is in direct contact with the sidewall of the cylinder-shaped bottom electrode.

11. The method according to claim 9, wherein the supporting structure comprises an oblique sidewall extending downwardly to a top surface of the cylinder-shaped bottom electrode.

12. The method according to claim 11, wherein the supporting structure comprises SiN or SiCN.

13. The method according to claim 12, wherein the cylinder-shaped bottom electrode comprises TiN.

14. The method according to claim 13 further comprising:
    forming a first protective layer on the oblique sidewall of the supporting structure; and
    forming a second protective layer on the cylinder-shaped bottom electrode.

15. The method according to claim 14, wherein the first protective layer comprises SiON or SiOCN.

16. The method according to claim 14, wherein the second protective layer comprises $TiO_2$.

17. The method according to claim 9, wherein the step of forming a supporting structure further comprising performing a $O_2$ treatment and a $Cl_2$ etch to form the V-shaped indentation on the top surface of the supporting structure.

18. The method according to claim 11, wherein the step of forming a supporting structure further comprising performing a $O_2$ treatment and a $Cl_2$ etch to form the oblique sidewall extending downwardly to a top surface of the cylinder-shaped bottom electrode.

\* \* \* \* \*